US012737257B2

(12) United States Patent
Zlotnik et al.

(10) Patent No.: US 12,737,257 B2
(45) **Date of Patent: *Sep. 15, 2026**

(54) SYNDROME DECODING SYSTEM

(71) Applicant: Micron Technology, Inc., Boise, ID (US)

(72) Inventors: Leon Zlotnik, Camino, CA (US); Eyal En Gad, Highland, CA (US); Fan Zhou, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 20 days.

This patent is subject to a terminal disclaimer.

(21) Appl. No.: 18/957,253

(22) Filed: Nov. 22, 2024

(65) Prior Publication Data

US 2025/0086056 A1 Mar. 13, 2025

Related U.S. Application Data

(63) Continuation of application No. 17/949,655, filed on Sep. 21, 2022, now Pat. No. 12,164,375.

(51) Int. Cl.

| | |
|---|---|
| ***G06F 11/10*** | (2006.01) |
| ***G06F 7/501*** | (2006.01) |
| ***G06F 11/07*** | (2006.01) |
| ***G11C 29/44*** | (2006.01) |
| ***G11C 29/52*** | (2006.01) |
| *H03M 13/11* | (2006.01) |

(Continued)

(52) U.S. Cl.

CPC .......... *G06F 11/1068* (2013.01); *G06F 7/501* (2013.01); *G06F 11/076* (2013.01); *G06F 11/0793* (2013.01); *G11C 29/44* (2013.01); *G11C 29/52* (2013.01); *H03M 13/1108* (2013.01); *H03M 13/1111* (2013.01); *H03M 13/151* (2013.01); *H03M 13/2948* (2013.01); *H03M 13/3746* (2013.01); *H03M 13/45* (2013.01)

(58) Field of Classification Search

CPC .... G06F 11/1068; G06F 7/501; G06F 11/076; G06F 11/0793; G06F 11/073; G06F 2201/81; G11C 29/44; G11C 29/52; H03M 13/1108; H03M 13/1111; H03M 13/151; H03M 13/2948; H03M 13/3746; H03M 13/45

USPC ........................................ 714/764, 785, 793

See application file for complete search history.

(56) References Cited

U.S. PATENT DOCUMENTS 6,260,087 B1 7/2001 Chang
6,938,193 B1 * 8/2005 Honda ................ G06F 11/1008 714/766

(Continued)

*Primary Examiner* — Albert Decady
*Assistant Examiner* — Osman M Alshack
(74) *Attorney, Agent, or Firm* — Brooks, Cameron & Huebsch, PLLC

(57) ABSTRACT

A method includes determining a quantity of errors for a bit string based on a quantity of bits having a logical value of one within the bit string and writing an indication corresponding to the quantity of errors for the bit string to an array of memory cells. The method can further include determining that the quantity of errors for the bit string has reached a threshold quantity of errors and refraining from performing a subsequent operation to determine the quantity of errors for the bit string in response to determining that the quantity of errors for the bit string has reached the threshold quantity of errors.

20 Claims, 5 Drawing Sheets

(51) Int. Cl.

| | |
|---|---|
| *H03M 13/15* | (2006.01) |
| *H03M 13/29* | (2006.01) |
| *H03M 13/37* | (2006.01) |
| *H03M 13/45* | (2006.01) |

(56) References Cited

U.S. PATENT DOCUMENTS

| | | | | |
|---|---|---|---|---|
| 8,397,143 | B2 | 3/2013 | Neznanov et al. | |
| 8,656,250 | B2 | 2/2014 | Gunnam et al. | |
| 8,930,799 | B1 * | 1/2015 | Langner | H03M 13/6325 714/758 |
| 2008/0104481 | A1 * | 5/2008 | Ito | G11B 20/1803 |
| 2010/0241933 | A1 * | 9/2010 | Latremouille | H04L 1/0052 714/E11.032 |
| 2012/0198308 | A1 | 8/2012 | Varnica et al. | |
| 2014/0245104 | A1 * | 8/2014 | Song | H03M 13/618 714/762 |
| 2017/0235632 | A1 * | 8/2017 | Healy | G06F 11/1024 714/764 |
| 2018/0175882 | A1 | 6/2018 | Hanham et al. | |
| 2018/0269905 | A1 * | 9/2018 | Bhatia | H03M 13/2963 |
| 2018/0343082 | A1 * | 11/2018 | Xiong | H04L 1/0057 |
| 2021/0184699 | A1 * | 6/2021 | Kwak | H03M 13/1575 |
| 2022/0236950 | A1 | 7/2022 | Hwang et al. | |
| 2024/0030938 | A1 | 1/2024 | Wang | |

* cited by examiner

SYNDROME DECODING SYSTEM

PRIORITY INFORMATION

This application is a Continuation of U.S. application Ser. No. 17/949,655, filed Sep. 21, 2022, which issued as U.S. Pat. No. 12,164,375B2 on Dec. 10, 2024, the contents of which are incorporated herein by reference.

TECHNICAL FIELD

Embodiments of the disclosure relate generally to digital logic circuits, and more specifically, relate to a syndrome decoding system.

BACKGROUND

A memory sub-system can include one or more memory devices that store data. The memory devices can be, for example, non-volatile memory devices and volatile memory devices. The memory sub-system can include one or more analog and/or digital circuits to facilitate operation of the memory sub-system. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
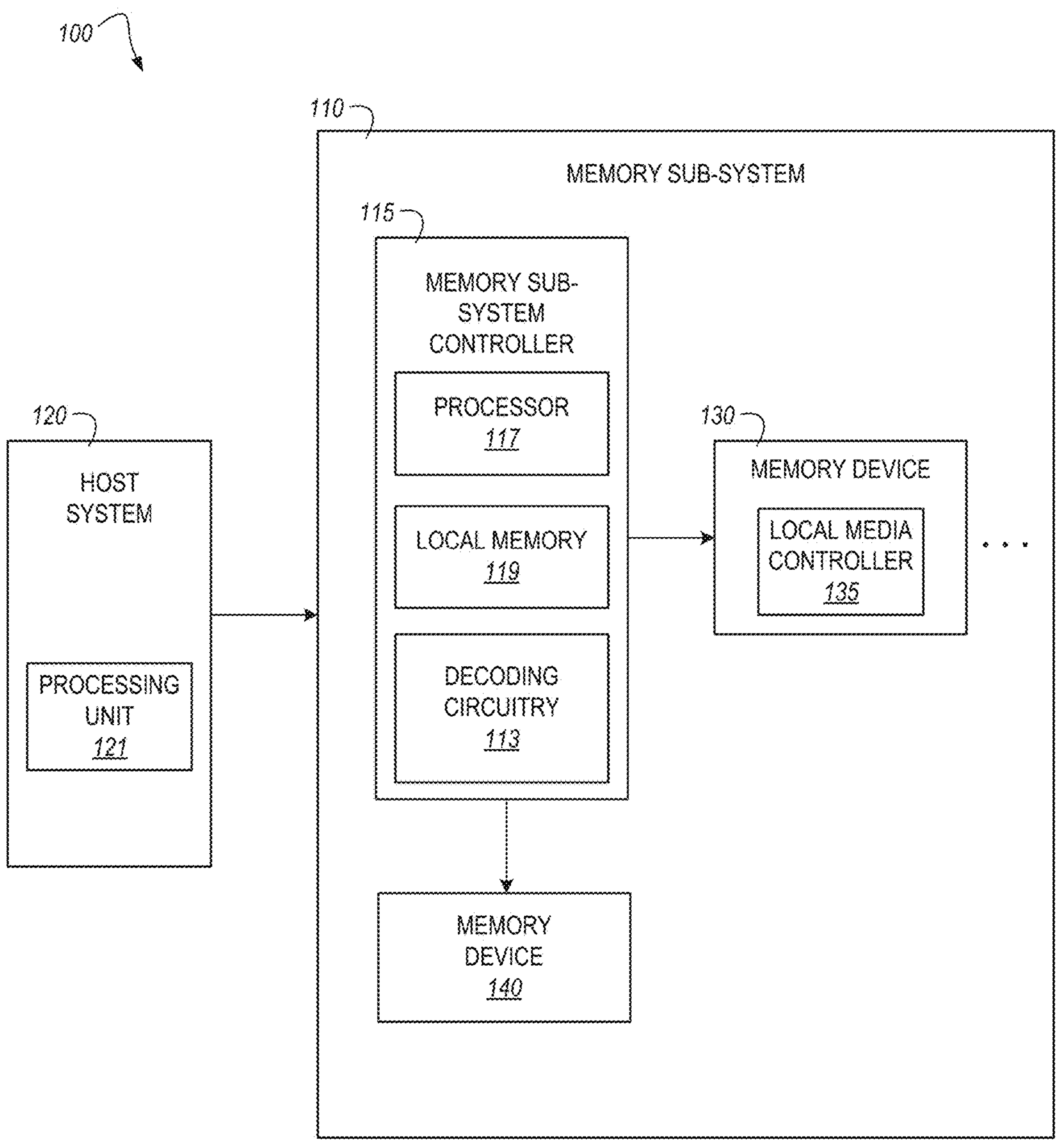
FIG. 1 illustrates an example computing system that includes a memory sub-system in accordance with some embodiments of the present disclosure.

Aspects of the present disclosure are directed to a syndrome decoding system and, in particular, to memory subsystems that include a syndrome decoding system. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory subsystem that includes one or more components, such as memory devices that store data. The host system can provide data to be stored at the memory sub-system and can request data to be retrieved from the memory sub-system.

During operation of the memory sub-system, data is written to and stored by one or more memory devices. The data (e.g., one or more codewords that can correspond to, for example, user data) can be encoded prior to being transferred to the memory device(s) and/or prior to being written to (e.g., stored) by the memory device(s). Upon retrieval of the data, the data is generally decoded. There are many techniques for decoding of codewords, some non-limiting examples of which include maximum likelihood decoding, minimum distance decoding (e.g., decoding techniques that seek to minimize a Hamming distance associated with a codeword), list decoding, and/or information set decoding, among others.

As will be appreciated such decoding techniques can be employed in a memory sub-system to detect bit errors in data, e.g., codewords, based on determining that bits associated with the data have incorrect states (e.g., a "1" where a "0" should be and vice versa). Some of the more common decoding techniques employed in the context of memory sub-systems include Hamming codes, Reed-Solomon (RS) codes, Bose-Chaudhuri-Hochquenghem (BCH) codes, circular redundancy check (CRC) codes, Golay codes, Reed-Muller codes, Goppa codes, neighbor-cell assisted error correction codes, low-density parity-check (LDPC) error correction codes, Denniston codes, and syndrome decoding, among others. While each of these decoding techniques enjoy their own benefits, they also can experience various drawbacks. For example, more accurate decoding techniques tend to consume more power and/or time, while less accurate decoding techniques may be performed faster and may consume less power. In the interest of clarity, the present disclosure will be described in terms of linear codes, such as LDPC codes and/or syndrome decoding, which may be generally referred to herein as "decoding techniques," given the context of the disclosure; however, it will be appreciated that the techniques described herein apply to other decoding techniques as well.

In some approaches decoding of bit strings and/or syndromes is achieved by processing the bit strings and/or syndromes through a series of flip-flops (which can include thousands of flip-flops) and applying a logical operation (e.g., a logical OR operation) to the bit strings and/or syndromes. In such approaches, the quantity of inputs of the logical operation is generally equal to the quantity of flip-flops used to process the bit strings and/or syndromes. If performance of the logical operation returns a particular value (e.g., a logical value of "0" in the case of a logical OR operation), the bit strings and/or syndromes are considered to be decoded.

For example, some approaches may utilize around 5,000 to 10,000 flip-flops to decode a set of bit strings and/or syndromes. In such approaches, a logic gate having around 5,000 to 10,000 inputs is required to perform a logical operation involving the bit strings and/or syndromes to determine whether the result of the logical operation returns the particular value. If the logical operation fails to return the particular value, all of the bit string and/or syndromes are fed back through the array of flip-flops and the logical operation is performed again. Given the quantity of flip-flops, the number of inputs on the logic gate, and the repetitive nature of performing decoding operations under such approaches, it is clear that a large amount of computing resources (e.g., power, time, etc.) can be consumed in decoding a set of bit strings and/or syndromes. Further, because such approaches generally process all the bit strings and/or syndromes iteratively until the result of the logical operation returns the particular value, for at least some iterations there may be fully decoded bit strings and/or syndromes that are being fed through the flip-flop array and logic despite being fully decoded.

Further, in some approaches, if can be difficult to prematurely abort the decoding operation, e.g., if it is determined that the bit strings and/or syndromes contain too many uncorrectable errors for the logical operation to ever result in the particular value and/or if it is determined that the decoding operation would take greater than a threshold period of time to complete. As an example, some approaches require the use of an adder device that can have around as many inputs as there are flip-flops and/or inputs to the logic gate in order to determine if a decoding operation should be aborted. In such approaches, all of the bit strings and/or syndromes may be summed by the adder to determine that the decoding operation should be aborted. This can add not only additional large circuitry to a system but can also consume additional computing resources above and beyond the computing resources already being consumed due to the repetitive nature of performing decoding operations under such approaches and the quantity of flip-flops and logic gate inputs utilized in such approaches, as mentioned above.

In order to address these and other deficiencies of current approaches, embodiments of the present disclosure allow for the tracking and checking of individual bit strings and/or syndromes during a decoding operation to determine whether the bit strings and/or syndromes have been successfully decoded. In some embodiments, this check is performed prior to the bit strings and/or syndromes being written back to an array of memory cells (e.g., an array of flip-flops) from which the bit strings and/or syndromes are retrieved and/or re-written in the case of bit strings and/or syndromes that are not fully decoded.

The check can include performing an operation to sum all the digits in the bit strings and/or syndromes that are non-zero (i.e., that contain an erroneous bit) to determine how many bits in error remain in each of the bit strings and/or syndromes. In addition, embodiments described herein provide an additional array of memory cells (or array of flip-flops, etc.) that can store and/or track the sums of the non-zero bits of each of the bit strings and/or syndromes while the digits in the bit strings and/or syndromes approach all zeros, which is indicative of the bit strings and/or syndromes being successfully decoded.

Once the digits contained in a particular bit string and/or syndrome reach zero (e.g., once the bit string and/or syndrome is successfully decoded), a "tracking sum" value of zero can be associated with the bit string and/or syndrome. This tracking sum value is then stored in the additional array of memory cells (or array of flip-flops, etc.) that stores and/or tracks the sums of the non-zero bits of each of the bit strings and/or syndromes. For bit strings and/or syndromes that have a tracking sum value of zero associated therewith, these bit strings and/or syndromes are no longer selected for processing in subsequent decoding operations. For example, in some embodiments, an input to a multiplexer that selects bit strings and/or syndromes to be read from the array of memory cells (e.g., an array of flip-flops) from which the bit strings and/or syndromes are retrieved and/or re-written in the case of bit strings and/or syndromes that are not fully decoded can be deselected such that bit strings and/or syndromes that have a tracking sum value of zero are no longer read from the array as part of a decoding operation.

In contrast, the bit strings and/or syndromes that do not have a tracking sum value of zero are subjected to a further iteration of a decoding operation and a new tracking sum value is determined subsequent to performance of each iteration of the decoding operation until the tracking sum values for the bit strings and/or syndromes have reached zero. In addition, embodiments herein provide for the decoding operation to be aborted simply by determining that a tracking sum value for one or more of the bit strings and/or syndromes and/or a tracking sum value associated with all of the bit strings and/or syndromes exceeds a threshold tracking sum value.

By removing the requirement exhibited in previous approaches that all of the bit strings and/or syndromes are iteratively decoded until all of the bit strings and/or syndromes have been decoded, embodiments of the present disclosure can reduce power consumed in performance of such decoding operations. For example, at least because bit strings and/or syndromes that have been successfully decoded are not re-processed, in contrast to previous approaches, embodiments herein reduce the amount of power consumed and the amount of time spent in decoding bit strings and/or syndromes, thereby improving the performance of a computing system in which embodiments of the present disclosure operate. Further, by providing a simplified approach to aborting a decoding operation (e.g., an approached based on a simple threshold), embodiments of the present disclosure can allow for decoding operations that may never converge (e.g., that may never be fully decoded due to the presence of a large number of uncorrectable errors, decoding operations that may take greater than a threshold period of time to complete, etc.) to be aborted efficiently and timely, thereby reducing the amount of power consumed and the amount of time spent in decoding bit strings and/or syndromes that may never converge and therefore improving the performance of a computing system in which embodiments of the present disclosure operate.

Further, embodiments of the present disclosure can reduce an amount of time consumed in performance of such decoding operations. For example, at least because bit strings and/or syndromes that have been successfully decoded are not re-processed, in contrast to previous approaches, it may be possible to speed up performance of the decoding operation. That is, because the data paths and/or logic corresponding to the various syndromes can be stalled once the syndromes have a value of zero (e.g., the syndrome no longer contains error indications), a subsequent non-zero syndrome can be processed while refraining from processing syndromes having a value of zero. In addition to reducing the dynamic power and leakage power consumed during the decoding operation, this can allow for non-zero syndromes to be processed (e.g., decoded) faster than previous approaches.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

In other embodiments, the computing system 100 can be deployed on, or otherwise included in a computing device such as a desktop computer, laptop computer, server, network server, mobile computing device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 includes a processing unit 121. The processing unit 121 can be a central processing unit (CPU) that is configured to execute an operating system. In some embodiments, the processing unit 121 comprises a complex instruction set computer architecture, such an x86 or other architecture suitable for use as a CPU for a host system 120.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via the same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include decoding circuitry 113. Although not shown in FIG. 1 so as to not obfuscate the drawings, the decoding circuitry 113 can include various circuitry to facilitate aspects of the disclosure described herein. In some embodiments, the decoding circuitry 113 can include special purpose circuitry in the form of an ASIC, FPGA, state machine, hardware processing device, and/or other logic circuitry that can allow the decoding circuitry 113 to orchestrate and/or perform operations to provide bit string and/or syndrome decoding, particularly with respect to a system-on-chip, in accordance with the disclosure. The decoding circuitry 113 is discussed in more detail in connection FIG. 2 and FIG. 3, herein.

In some embodiments, the memory sub-system controller 115 includes at least a portion of the decoding circuitry 113. For example, the memory sub-system controller 115 can include a processor 117 (processing device) configured to execute instructions stored in local memory 119 for performing the operations described herein. In some embodiments, the decoding circuitry 113 is part of the host system 110, an application, or an operating system. The decoding circuitry 113 can be resident on the memory sub-system 110 and/or the memory sub-system controller 115. As used herein, the term "resident on" refers to something that is physically located on a particular component. For example, the decoding circuitry 113 being "resident on" the memory sub-system 110, for example, refers to a condition in which the hardware circuitry that comprises the decoding circuitry 113 is physically located on the memory sub-system 110. The term "resident on" may be used interchangeably with other terms such as "deployed on" or "located on," herein.

Figure 2:
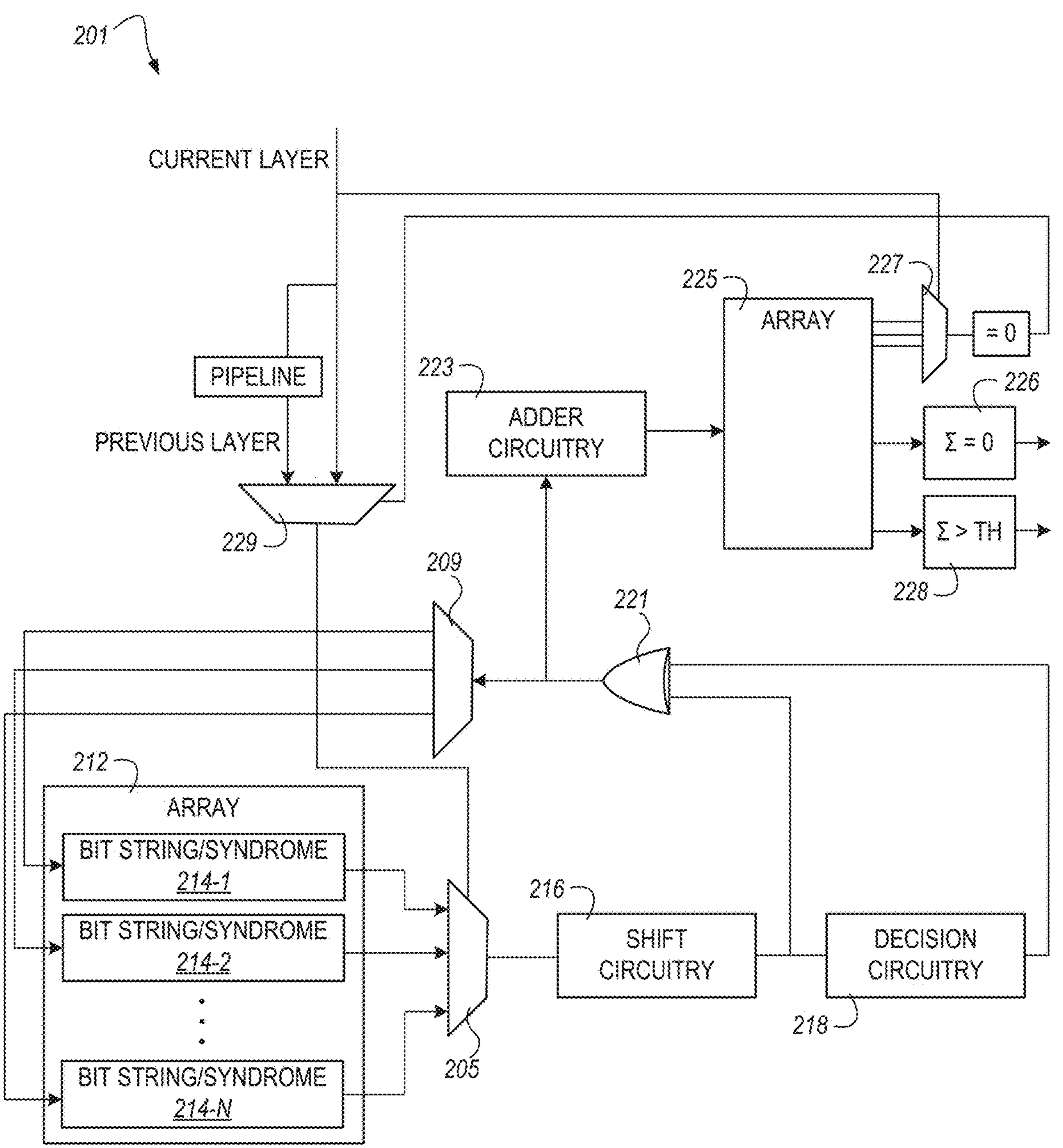
FIG. 2 illustrates an example of a syndrome decoding system in accordance with some embodiments of the present disclosure.

FIG. 2 illustrates an example of a syndrome decoding system 201 in accordance with some embodiments of the present disclosure. The syndrome decoding system 201 includes at least a portion of the decoding circuitry 113 illustrated in FIG. 1. The example system 201, which can be referred to in the alternative as an "apparatus," includes an array 212 (e.g., a "first" array) that can include devices configured to store bit strings and/or syndromes 214-1, 214-2, to 214-N, (which can be referred to collectively as bit strings and/or syndromes 214). In some embodiments, the bit strings and/or syndromes 214 comprise codewords that are utilized by the memory sub-system 110. As used herein, the term "codeword" generally refers to a data word having a specified size (e.g., 4 KB, etc.) that is encoded such that the codeword can be individually protected by some error encoding and/or decoding scheme. For example, a "codeword" can refer to a set of bits (e.g., a bit string and/or a syndrome) that can be individually encoded and/or decoded. In general, for NAND type memory devices, a "codeword" can represent the smallest unit (e.g., set of bits) that can be read by a memory device, host device, or other computing device associated with the system 201. Although not explicitly shown in FIG. 2, one or more of the components illustrated can be one of a plurality of such components. For example, the decision circuitry 218 can be a single decision circuit 218 of any quantity of decision circuits 218 (e.g., there can be eight, ten, twelve, etc. decisions circuits 218, eight, ten, twelve, etc. shift circuits, 216, etc. although embodiments are not limited to this particular quantity).

The array 212 can be an array of memory cells and/or an array of flip-flops and/or latches, etc. As shown in FIG. 2, the array 212 is coupled to a multiplexer (or "MUX") 205 that is configured to selectively transfer one or more of the bit strings and/or syndromes 214 to shift circuitry 216. In some embodiments, the shift circuitry 216 can comprise a barrel shifter that is configured to shift the bit strings and/or syndromes 214 by a specified number of bits. That is, in some embodiments, the shift circuitry 216 can shift the bit strings and/or syndromes 214 by a specified number of bits using pure combinatorial logic. Embodiments are not so limited, however, and it is contemplated within the disclosure that the shift circuitry 216 can be configured to perform shift operations involving the bit strings and/or syndromes 214 utilizing other combinatorial logic techniques (e.g., circular shifting, etc.) and/or sequential logic techniques.

The shift circuitry 216 is coupled to decision circuitry 218. The decision circuitry 218 includes hardware circuitry that is configured to correct erroneous bits (e.g., bit-flip errors) in the bit strings and/or syndromes 214. In some embodiments, the decision circuitry 218 can cause one or more bits in the bit strings and/or syndromes 214 to be flipped based on a determined probability that such bits are erroneous. The probability that one or more bits in the bit strings and/or syndromes 214 is to be flipped can be determined using various linear codes, such as syndrome decoding codes, LDPC codes, etc. Embodiments are not limited to cases in which the decision circuitry 218 causes one or bits in the bit strings and/or syndromes 214 to be flipped based on a determined probability that such bits are erroneous (e.g., through the use of a linear decoding technique), however, and in some embodiments, the decision circuitry 218 can determine which bits of the bit strings and/or syndromes 214 are erroneous based on mathematical inference algorithms, machine learning algorithms, and/or other suitable techniques for determining which bits of the bit strings and/or syndromes 214 are erroneous.

In a simplified example that is provided for illustrative purposes, take a syndrome 214 that contains the following bit pattern: [1 0 0 1 0 1 1 0], the decision circuitry 218 may determine that the second bit (from the right) is likely to be erroneous and can therefore process the syndrome 214 to flip the second bit thereby yielding the following new syndrome [1 0 0 1 0 1 0 0]. Such bit flip gets the decoder closer to a codeword (in which all the syndrome bits are zero). Embodiments are not limited to scenarios in which the decision circuitry 218 causes only a single bit to be flipped as part of decoding the syndromes 214, however. For example, using the same initial syndrome given above [1 0 0 1 0 1 1 0], the decision circuitry 218 may determine that the second bit, the third bit, and the eighth bit are likely to be erroneous and can therefore process the syndrome 214 to flip the second bit, the third bit, and the eighth bit thereby yielding the following new syndrome [0 0 0 1 0 0 0]. It is noted that these illustrative non-limiting examples can be part of an iterative decoding process in which the syndrome 214 are processed by the decision circuitry 218 multiple times in an effort to decode such syndromes 214. Accordingly, the illustrative non-limiting example given above can represent operations performed by the decision circuitry 218 at a first iteration of the decoding process, or at any subsequent iteration of the decoding process.

Once the decision circuitry 218 has attempted to correct one or more erroneous bits in the bit strings and/or syndromes 214, the bit strings and/or syndromes 214 can be transferred to an input of a logical gate 221. In some embodiments, when one or more bits of a bit string are corrected, a corresponding syndrome (which can reflect an error state corresponding to a bit string) can be updated to reflect a current error state of the syndrome. Although in some embodiments, it is the syndrome that is processed (e.g., by the multiplexer 205, the shift circuitry 216, the decision circuitry 218, the logic gate 221, etc.), the following non-limiting examples make reference to both bit strings and/or syndromes in order to illustrate various aspects of the present disclosure. As shown in FIG. 2, the logic gate 221 is a XOR gate, although embodiments are not limited to the utilization of a XOR gate. In embodiments in which the logic gate 221 comprises a XOR gate, the bit strings and/or syndromes 214 processed by the decision circuitry 218 are received as inputs by the logic gate 221 and a logical XOR operation is performed thereon. As will be appreciated, if the result of the logical XOR operation returns a value of zero, the bit string and/or syndrome 214 has successfully been decoded. In response to determining that the bit string and/or syndrome 214 has been successfully decoded, an indication that the bit string and/or syndrome 214 that has been successfully decoded is written to the array 225 and the de-multiplexer 209 is set such that further processing (e.g., retrieving from the array 212, shifting through the shift circuitry 216, processing by the decision circuitry 218, etc.) of that particular the bit string and/or syndrome 214 is avoided. It will be appreciated that, in general, it is the bit string that has been decoded because, as mentioned above, the syndrome generally reflects a current error state associated with data contained within the bit string and, once the value of the syndrome has reached zero, it implies that the bit string has been decoded; however, in keeping with the conventions outlined in the present disclosure, reference to both bit strings and/or syndromes is utilized in order to illustrate various aspects of the present disclosure.

Bit strings and/or syndromes 214 that are not successfully decoded, a quantity of bits that do not return a zero value after being passed through the logic gate 221 are summed by the adder circuitry 223 and a numerical value corresponding to the sum of the quantity of bits that do not return the zero value (e.g., a "tracking sum value") is written to the array 225. In general, the adder circuitry 223 includes hardware and/or logic circuitry that is configured to perform addition operations to sum particular values (e.g., a quantity of bits associated with one or more bit strings and/or syndromes that have a logical value of "1" and/or a logical value of "0" associated therewith).

In some embodiments, the array 212 is configured to store one tracking sum value per bit string and/or syndrome 214 for each layer and/or iterations of the decoding operation. These bit strings and/or syndromes 214 are written back to the array 212 via the de-multiplexer 209, and a subsequent iteration of the decoding operation is performed, as described above. It is noted that, in contrast to previous approaches in which all of the bit strings and/or syndromes 214 participate in the subsequent iteration of the decoding operation, embodiments herein provide that at least some of the bit strings and/or syndromes 214 do not participate in every subsequent iteration of the decoding process, thereby reducing the power consumed by the system 201 in performing the decoding operation. For example, at least because embodiments herein do not fire every row of the array 212 (as some of the bit strings and/or syndromes 214 that have been successfully decoded are not further processed), the amount of power consumed is decreased (1) due to firing fewer rows of the array 212 as the quantity of iterations of the decoding operation increases, (2) refraining from operating the shift circuitry 216 corresponding to bit strings and/or syndromes 214 that have been successfully decoded as the quantity of iterations of the decoding operation increases, and (3) refraining from operating the decision circuitry 218 for bit strings and/or syndromes 214 that have been successfully decoded as the quantity of iterations of the decoding operation increases.

As iterations of the decoding operation are performed, in general, the adder circuitry 223 will process an increasing quantity of bit strings and/or syndromes 214 that have been successfully decoded and will therefore process more bit strings and/or syndromes 214 that have a sum of bits (after being subjected to the logical gate 221) that is equal to zero. As this occurs, the adder circuit 223 will write (or overwrite in the case of bit strings and/or syndromes 214 that have previous sums of bits that do not equal zero from previous iterations of the decoding operation) an increasing quantity of tracking sum value that is equal to zero. Once the bit strings and/or syndromes 214 have all been successfully decoded, it can be determined at block 226 that the sum of all of the tracking sum values in the array 225 is equal to zero, thereby indicating that the decoding operation has been successfully performed on all of the bit strings and/or syndromes 214.

If, however, it appears that the tracking sum values of the bit strings and/or syndromes 214 may not converge to zero (e.g., there are too many uncorrectable errors in at least a threshold quantity of bit strings and/or syndromes 214), it can be determined at block 228 that the decoding operation may not successfully conclude. That is, if at block 228 it is determined that a sum of the tracking sum values written to the array 221 is greater than a threshold error quantity value for the bit strings and/or syndromes 214, the decoding operation may not successfully complete, and the decoding operation can be aborted.

As mentioned above, in contrast to approaches in which a large adder circuit sums values associated with the bits in all the bit strings and/or syndromes 214 subsequent to one or more iterations of a decoding operation in order to determine if the decoding operation should be aborted, embodiments herein allow for the decoding operation to be aborted simply by checking whether a sum of all the tracking sum values written to the array 221 meets or exceeds a threshold value and, in response to determining that the sum of all the tracking sum values written to the array 221 meets or exceeds the threshold value, aborting the decoding operation. This feature can allow for simplified abortion of decoding operations that are determined to be unlikely to converge (e.g., to result in successful decoding of the bit strings and/or syndromes 214) as compared to previous approaches, thereby minimizing an amount of power consumed in performing iterations of a decoding operation that is likely to fail.

As shown in FIG. 2, an additional multiplexer 227 can be coupled to the array 225. The multiplexer 227 receive as inputs tracking sum values for the bit strings and/or syndromes 214 that have been written to the array 225. For tracking sum values corresponding to the bit strings and/or syndromes 214 that indicate that the bit strings and/or syndromes 214 have been successfully decoded (e.g., for tracking sum values equal to zero), an output signal can be transferred to the multiplexer 229 to cause the multiplexer 229 to deselect outputs of the multiplexer 229 corresponding to the bit strings and/or syndromes 214 that have been successfully decoded.

For tracking sum values corresponding to the bit strings and/or syndromes 214 that indicate that the bit strings and/or syndromes 214 have not been successfully decoded (e.g., for tracking sum values not equal to zero), an output signal can be transferred to the multiplexer 229 to select outputs of the multiplexer 229 corresponding to the current layer and/or iteration and/or the previous layer and/or iteration. In addition, an output signal can be transferred to the multiplexer 229 corresponding to selection between a "current layer" and a "previous layer." In general, when a syndrome has a value of zero, the previous layer is selected in order to effectively stall the data path thereby reducing an amount of power consumed by the system 201. In contrast, if the syndrome is not equal to zero, the current layer can be selected such that the syndrome is further processed as part of the decoding operation. In this manner, which of the bit strings and/or syndromes 214 are subjected to subsequent decoding operations and which of the bit strings and/or syndromes 214 are not subjected to subsequent decoding operations can be determined on, for example, a layer-by-layer, iteration-by-iteration, and/or bit string/syndrome-by-bit string/syndrome basis to minimize power consumption of the system 201 while performing the decoding operations described herein.

In a non-limiting example, an apparatus (e.g., the computing system 100 illustrated in FIG. 1, the decoding circuitry 113 illustrated in FIG. 1, the syndrome decoding systems 201/301 illustrated in FIG. 2 and FIG. 3, and/or components thereof), includes a first array 212 of memory cells (or other storage locations such as flip-flops, etc.) configured to store a plurality of bit strings and/or syndromes 214 (referred to in brevity as the "syndromes" 214 in this non-limiting example) that each comprise a plurality of bits of data. The plurality of bits of data can correspond to user data in some examples, or other data that is written to a memory sub-system such as the memory sub-system 110 illustrated in FIG. 1. The apparatus can further include first circuitry (e.g., the decision circuitry 218) coupled to the first array 212 that is configured to determine a quantity of errors contained within each of the syndromes 214 based on a quantity of bits having a logical value of one ("1") within the each of the syndromes 214.

In some embodiments, second circuitry (e.g., the adder circuitry 223) can be coupled to the first circuitry. The second circuitry can be configured to, for each of the syndromes 214, write an indication corresponding to the quantity of bits having the logical value of one within the each of the syndromes 214 to a second array of memory cells (e.g., the array 225). The second circuitry can further determine that the quantity of errors for at least one of the syndromes 214 has reached a threshold quantity of errors and refrain from performing a subsequent operation to determine the quantity of errors contained within the at least one of the syndromes 214 in response to the determination that the quantity of errors contained within the at least one of the syndromes 214 has reached the threshold quantity of errors.

For example, a summed quantity of bits that have not been successfully decoded within one or more of the syndromes 214 can be determined by the second circuitry and an indication corresponding to this summed quantity of bits that are in error (e.g., the "tracking sum value) can be written to the array 225. Embodiments are not so limited and one or more of the individual components of the apparatus can operate in concert to determine the summed quantity of bits that have not been successfully decoded within one or more of the syndromes 214 and/or can cause the tracking sum value corresponding to such bits to be written to the array 225.

Continuing with this example, the second circuitry (e.g., the adder circuitry 223 and/or components coupled thereto) can determine that the quantity of errors for at least a second one of the syndromes 214 has reached a threshold quantity of errors and refrain from performing a subsequent operation to determine the quantity of errors contained within the at least the second one of the syndromes 214 in response to the determination that the quantity of errors contained within the at least second one of the syndromes has reached the threshold quantity of errors. That is, because the decoding operations described herein can be iterative decoding operations, the second circuitry can determine that the quantity of errors for subsequently decoded syndromes 214 have reached respective threshold quantities of errors and, in response to such a determination, can cause further decoding operations (e.g., subsequent iterations of a decoding operation) to be performed on the syndromes 214 that have been determined to be successfully decoded based on the tracking sum values associated therewith.

As mentioned, the first circuitry can include the decision circuitry 218. Embodiments are not so limited, however, and the first circuitry can further include the shift circuitry 216, the multiplexer 205, etc. Further, as mentioned, the second circuitry can include the adder circuitry 223. Embodiments are not so limited, however, and the second circuitry can further include the logic circuitry 221, the de-multiplexer 209, the circuitry that operates the blocks 226 and/or 228, the multiplexer 227, and/or the multiplexer 229, etc. In some embodiments, the adder circuitry 223 can comprise a logical NAND gate, such as the NAND gate 332 illustrated in FIG. 3, herein.

In some embodiments, the second circuitry is configured to refrain from performing the subsequent operation (e.g., subsequent decoding operations) in order to reduce an amount of power consumed in operation of a computing system (e.g., the system 201 and/or the system 100 illustrated herein) that comprises the first circuitry, the second circuitry, the first array of memory cells, and the second array of memory cells. In embodiments in which the first circuitry, the second circuitry, the first array of memory cells, and/or the second array of memory cells comprise a system-on-chip, the second circuitry can be configured to refrain from performing the subsequent operation (e.g., subsequent decoding operations) in order to reduce an amount of power consumed by the system-on-chip.

Continuing with this example, the first circuitry can be configured to determine the quantity of errors contained within each of the syndromes 214 as part of performance of an operation to decode data associated with each of the syndromes 214, and the second circuitry can be configured to determine that the quantity of errors for the at least one of the syndromes 214 has reached the threshold quantity of errors as part of performance of the operation to decode data associated with each of the syndromes 214. As mentioned above, operations to decode the syndromes 214 can include operations to correct erroneous bits contained within the syndromes 214.

In some embodiments, the second circuitry can be configured to determine that the quantity of errors for at least the one of the syndromes 214 has reached the threshold quantity of errors when each bit among the quantity of bits for at least the one of the syndromes has a logical value of zero as illustrated at block 226. However, if it is determined that the syndromes 214 may not be able to be successfully decoded, the second circuitry can be configured to determine that the quantity of errors for at least the one of the syndromes 214 has reached the threshold quantity of errors when a determination is made that at least the one of the syndromes cannot be decoded successfully as illustrated at block 228.

In another non-limiting example, a system (e.g., the system 201 and/or the system 301 of FIG. 3) includes a first array 212 of memory cells configured to store a plurality of syndromes 214 that each comprise a plurality of bits of data. The system 201 further includes shift circuitry 216 configured to, for each of the plurality of syndromes 214, transfer the plurality of bits of data for each of the syndromes 214 to decision circuitry 218 coupled to the shift circuitry 216. In some embodiments, the decision circuitry 218 is configured to determine a quantity of errors contained within each of the syndromes 214 based on a quantity of bits having a logical value of one within the each of the syndromes 214.

In this example, the system 201 can further include adder circuitry 223 (and/or the logic gate 332 of FIG. 3) coupled to the decision circuitry 218. The adder circuitry 223 can sum the quantity of bits having the logical value of one within the each of the syndromes to generate a decoding completion indication (e.g., a tracking sum value) for each of the syndromes 214), write the decoding completion indication for each of the syndromes to a second array 225 of memory cells, and determine, based on the decoding completion indication, that the quantity of errors for at least one of the syndromes 214 has reached a threshold quantity of errors. As described herein, the decision circuitry 218 can then refrain from performing a subsequent operation to determine the quantity of errors contained within the at least one of the syndromes 214 in response to the determination that the quantity of errors contained within the at least one of the syndromes 214 has reached the threshold quantity of errors.

As mentioned herein, the shift circuitry 216 can include a plurality of shift circuitries and the decision circuitry 218 can include a plurality of decision circuitries. In such embodiments, the shift circuitry 216 and the decision circuitry 218 are configured to process the plurality of syndromes 214 concurrently. That is, multiple shift circuitries and/or decision circuitries can be provided to process, in parallel, a plurality of the syndromes 214 concurrently.

In some embodiments, the system 201 can include decode completion circuitry (e.g., the blocks 226/228 and/or the logic gate 334 of FIG. 3) coupled to the second array 225 of memory cells. The decode completion circuitry can determine that a decoding operation involving the at least one of the syndromes 214 is complete in response to the determination that the quantity of errors contained within the at least one of the syndromes 214 has reached the threshold quantity of errors (e.g., at block 226), as discussed above. Embodiments are not so limited, however, and in some embodiments, the decode completion circuitry can determine that a decoding operation involving at least one of the syndromes has failed in response to the determination that the quantity of errors contained within the at least one of the syndromes has reached the threshold quantity of errors (e.g., at block 228).

Continuing with this non-limiting example, the decision circuitry 218 can refrain from performing the subsequent operation to determine the quantity of errors contained within the at least one of the syndromes 214 by removing power supplied to a portion of the first memory array 212 that stored the at least one of the syndromes 214 and/or refrain from performing the subsequent operation to determine the quantity of errors contained within the at least one of the syndromes 214 by removing power supplied to a portion of the shift circuitry 216 associated with the at least one of the syndromes 214. Further, as described herein, the decision circuitry 218 can be configured to refrain from performing the subsequent operation in order to reduce an amount of power consumed in operation of a computing system (e.g., the computing system 100 of FIG. 1, the syndrome decoding system 201/301 of FIG. 2 and FIG. 3, etc.) that includes the first array 212 of memory cells, the second array 225 of memory cells, the decision circuitry 218, or the adder circuitry 223, or any combination thereof.

Figure 3:
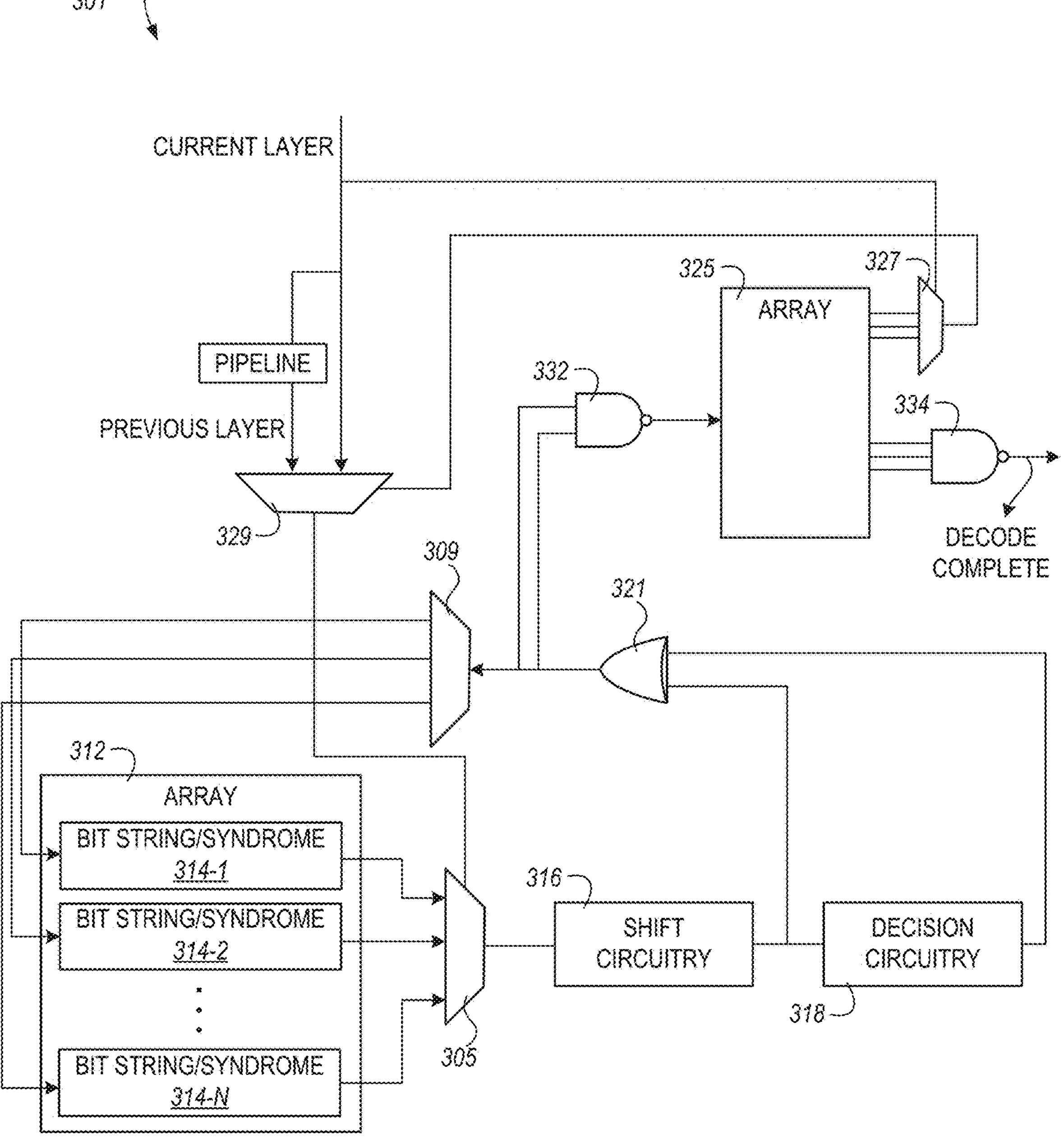
FIG. 3 illustrates another example of a syndrome decoding system in accordance with some embodiments of the present disclosure.

FIG. 3 illustrates another example of a syndrome decoding system 301 in accordance with some embodiments of the present disclosure. The system 301 can generally be analogous to the system 201 of FIG. 2. For example, the array 312, bit strings/syndromes 314-1, 314-2 to 314-N, the multiplexer 305, the shift circuitry 316, the decision circuitry 318, the logic circuitry 321, the multiplexer 309, the array 325, the multiplexer 327, and the multiplexer 329 can be analogous to the array 212, bit strings/syndromes 214-1, 214-2 to 214-N, the multiplexer 205, the shift circuitry 216, the decision circuitry 218, the logic circuitry 221, the de-multiplexer 209, the array 225, the multiplexer 227, and the multiplexer 229 illustrated and discussed above in connection with FIG. 2.

In contrast to the embodiment shown in FIG. 2, the embodiment of FIG. 3 includes a logic gate 332 in place of the adder circuitry 223 of FIG. 2 and another logic gate 334 in place of blocks 226 and 228 of FIG. 2. The overall system 301 operates in the same manner the system 201 of FIG. 2 and, accordingly, a redundant discussion of the details of operation and performance of decoding operations involving the bit strings/syndromes 314 is omitted. Instead, the use of the logic gate 332 and the logic gate 334 is discussed below.

As shown in FIG. 3, a logic gate 332 can be used in place of the adder circuitry 223 of FIG. 2 in accordance with embodiments of the disclosure. For example, a NAND logic gate (among other types of logic gate) can replace the adder circuitry 223 of FIG. 2. In embodiments in which a NAND gate is utilized for the logic gate 332, the logic gate 332 can receive as inputs bit strings/syndromes 314 that have been subject to one or more iterations of a decoding operation (e.g., bit strings/syndromes 314 that have been processed by the shift circuitry 316, the decision circuitry 318, and/or the logic circuitry 321). The logic gate 332 can be configured to output an indication corresponding to a quantity of bits that have not been successfully decoded within one or more of the syndromes 314 (or an indication corresponding to a quantity of bits that have been successfully decoded within one or more of the syndromes 314). In some embodiments, the indication can be as simple as a logical value of "1" indicating that one or more errors are present in the syndrome(s) or a logical value of "0" indicating that no errors are present in the syndrome(s). The indication can be analogous to the "tracking sum value" discussed above and can be written to the array 325, as discussed above in connection with FIG. 2.

The logic gate 334 can receive as inputs the tracking sum values written to the array 325 to determine if the decoding operation is complete. In some embodiments, the tracking sum values can be Boolean logic values (e.g., logical "1s" or logical "0s"). The logic gate 334 can be used in place of the blocks 226 and 228 illustrated and discussed above in connection with FIG. 2. In some embodiments, the logic gate 334 can comprise a NAND logic gate (among other types of logic gate). In embodiments in which the logic gate 334 comprises a NAND logic gate, the NAND logic gate can receive the tracking sum values corresponding to each of the bit strings and/or syndromes 314 and perform a logical operation to determine if the decoding operation is complete. If it is determined that the decoding operation is not complete, additional decoding operations can be performed on bit strings/syndromes 314 that have not been successfully decoded, as discussed above. If it is determined, based on the result of the logical operation performed by the logic gate 334 that the decoding operation is complete, an indication that the decode operation is complete can be transferred to circuitry external to the system 301.

Figure 4:
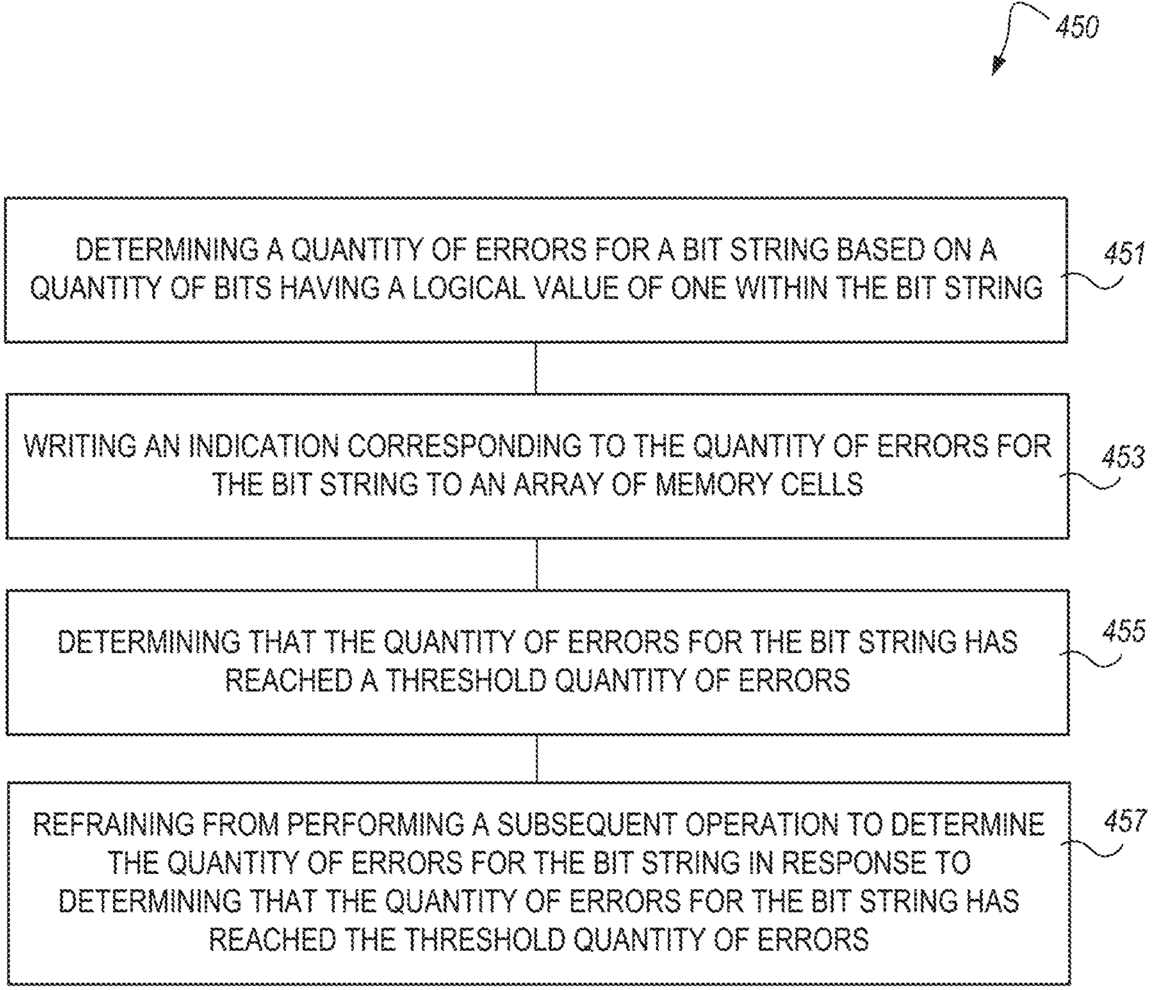
FIG. 4 is a flow diagram corresponding to a method for a syndrome decoding system in accordance with some embodiments of the present disclosure.

FIG. 4 is a flow diagram corresponding to a method 450 for a syndrome decoding system in accordance with some embodiments of the present disclosure. The method 450 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 450 is performed by the decoding circuitry 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 451, the method 450 includes determining a quantity of errors for a bit string based on a quantity of bits having a logical value of one within the bit string. The bit string can be one or more of the bit strings and/or syndromes 214/314 discussed above in connection with FIG. 2 and FIG. 3. Further, as described above, the logical value (e.g., the logical value of "1" can be determined by processing the bit string during performance of a decoding operation as described above). In some embodiments, the method 450 can include determining the quantity of errors for the bit string by operating adder circuitry (e.g., the adder circuitry 223 of FIG. 2 and/or the logic gate 332 of FIG. 3) that is configured to sum the quantity of bits having the logical value of one within the bit string.

As discussed above, the method 450 can further include determining the quantity of errors for the bit string as part of a decoding operation to correct one or more bit-flip errors within the bit string. For example, the bit string can comprise a syndrome and the method 450 can include performing a decoding operation on the syndrome as part of determining the quantity of errors for the bit string. In some embodiments, the method 450 can include determining the quantity of bits having the logical value of one within the bit string using decision circuitry (e.g., the decision circuitry 218/318 illustrated in FIG. 2 and FIG. 3, herein).

At operation 453, the method 450 includes writing an indication corresponding to the quantity of errors for the bit string to an array of memory cells. In some embodiments, the indication corresponding to the quantity of errors for the bit string can be a tracking sum value that is written to the array 225/325 illustrated in FIG. 2 and FIG. 3, herein.

At operation 455, the method 450 includes determining that the quantity of errors for the bit string has reached a threshold quantity of errors. In some embodiments, determining that the quantity of errors for the bit string has reached a threshold quantity of errors can be performed by the blocks 226 and/or 228 illustrated in FIG. 2 and/or by the logic gate 334 illustrated in FIG. 3.

At operation 457, the method 450 includes refraining from performing a subsequent operation to determine the quantity of errors for the bit string in response to determining that the quantity of errors for the bit string has reached the threshold quantity of errors. Further, as described above, once a particular bit string has been successfully decoded (e.g., the determined tracking sum value associated with said bit string returns a string of zeros indicating that there are no erroneous bits contained in the bit string), subsequent decoding operations may not be performed on said bit string. In some embodiments, the method 450 can include refraining from performing the subsequent operation in order to reduce an amount of power consumed in operation of a computing system and/or or to increase a speed at which a decoding operation is performed within the computing system (e.g., the computing system 100 of FIG. 1, the syndrome decoding system 201/301 illustrated in FIG. 2 and FIG. 3, etc.) in which the bit string is processed.

In some embodiments, the bit string is one of a plurality of bit strings that are processed in parallel. In such embodiments, the method 450 can include determining a quantity of errors for each of the plurality of bit strings based on a quantity of bits having a logical value of one for each of the plurality of bit strings and writing an indication corresponding to the quantity of errors for each of the plurality of bit strings to an array of memory cells. The method 450 can further include determining that the quantity of errors for at least one of the plurality of bit strings the bit string has reached a threshold quantity of errors and refraining from performing a subsequent operation to determine the quantity of errors for the at least one bit string in response to determining that the quantity of errors for the bit string has reached the threshold quantity of errors.

Figure 5:
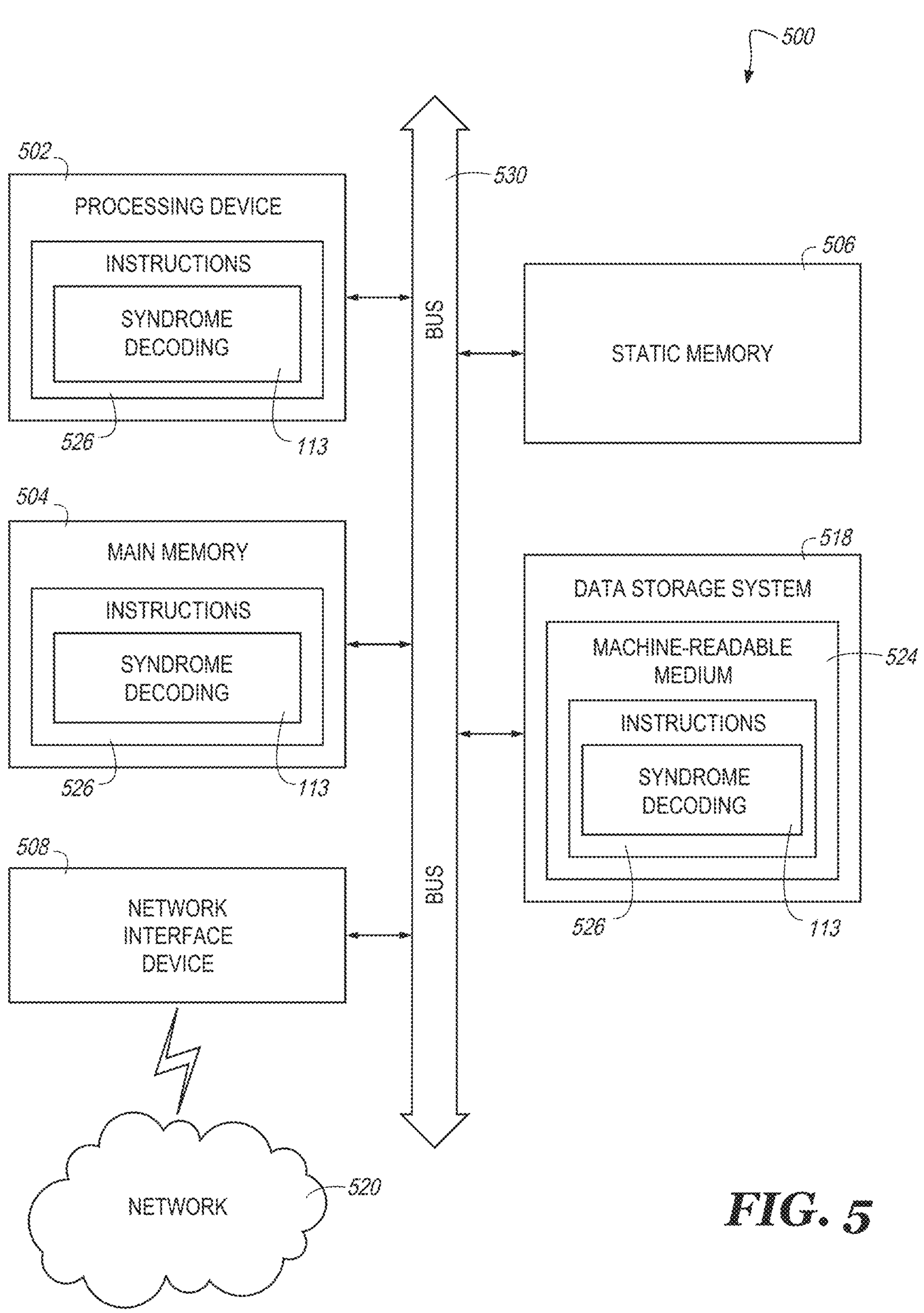
FIG. 5 is a block diagram of an example computer system in which embodiments of the present disclosure may operate.

FIG. 5 is a block diagram of an example computer system in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the decoding circuitry 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to syndrome decoding circuitry (e.g., the decoding circuitry 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:

determining a quantity of errors for a bit string based on a quantity of bits having a logical value of one or a logical value of zero, or both, within the bit string;

writing an indication corresponding to the quantity of errors for the bit string to an array of memory cells;

determining whether the quantity of errors for the bit string has reached a threshold quantity of errors prior to writing the bit string to the array of memory cells;

responsive to a determination that the quantity of errors for the bit string has reached the threshold quantity of errors, refraining from performing a subsequent operation to correct the quantity of errors for the bit string; and responsive to a determination that the quantity of errors for the bit string has not reached the threshold quantity of errors:

responsive to the quantity of errors for the bit string being equal to zero, refraining from performing the subsequent operation to correct the quantity of errors for the bit string and causing the bit string to be written to the array of memory cells; and responsive to the quantity of errors for the bit string not being equal to zero, performing the subsequent operation to correct the quantity of errors for the bit string and causing the corrected bit string to be written to the array of memory cells.

2. The method of claim 1, further comprising determining the quantity of errors for the bit string by operating adder circuitry that is configured to sum the quantity of bits having the logical value of one within the bit string and as part of a decoding operation to correct one or more bit-flip errors within the bit string.

3. The method of claim 1, wherein the bit string is one of a plurality of bit strings that are processed in parallel, and wherein the method further comprises:

determining a quantity of errors for each of the plurality of bit strings based on a quantity of bits having a logical value of one for each of the plurality of bit strings;

writing an indication corresponding to the quantity of errors for each of the plurality of bit strings to an array of memory cells;

determining that the quantity of errors for at least one of the plurality of bit strings the bit string has reached a threshold quantity of errors; and refraining from performing a subsequent operation to determine the quantity of errors for the at least one bit string in response to determining that the quantity of errors for the bit string has reached the threshold quantity of errors.

4. The method of claim 1, wherein, prior to determining the quantity of errors for the bit string based on the quantity of bits having a logical value of one within the bit string the method comprises determining the quantity of bits having the logical value of one within the bit string using decision circuitry.

5. The method of claim 1, wherein:

the bit string comprises a syndrome, and the method further comprises performing a decoding operation on the syndrome as part of determining the quantity of errors for the bit string.

6. The method of claim 1, further comprising refraining from performing the subsequent operation in order to reduce an amount of power consumed in operation of a computing system in which the bit string is processed or to increase a speed at which a decoding operation is performed within the computing system, or both.

7. An apparatus, comprising:

a first array of memory cells configured to store a plurality of syndromes that each comprise a plurality of bits of data;

first circuitry coupled to the first array and comprising a multiplexer configured to selectively transfer one or more of the plurality of syndromes to decision circuitry, the decision circuitry configured to determine a quantity of errors contained within each of the syndromes based on a quantity of bits having a logical value of one within each of the syndromes; and second circuitry coupled to the first circuitry and configured to, for each of the syndromes:

determine whether each of the syndromes has been fully decoded;

responsive to a determination that at least one of the syndromes has been fully decoded:

write an indication, corresponding to the at least one of the fully decoded syndromes, to a second array of memory cells;

avoid further processing of the at least one of the fully decoded syndromes; and refrain from performing a subsequent operation to determine the quantity of errors contained within the at least one of the fully decoded syndromes; and responsive to a determination that at least one of the syndromes has not been fully decoded:

responsive to determining that the quantity of errors for the syndromes not fully decoded has reached a threshold quantity of errors, refrain from performing a subsequent operation to determine the quantity of errors contained within the syndromes not fully decoded.

8. The apparatus of claim 7, second circuitry coupled to the first circuitry, wherein the second circuitry is configured to:

determine that the quantity of errors for at least a second one of the syndromes not fully decoded has reached the threshold quantity of errors; and refrain from performing a subsequent operation to determine the quantity of errors contained within the at least the second one of the syndromes not fully decoded in response to the determination that the quantity of errors contained within the at least second one of the syndromes not fully decoded has reached the threshold quantity of errors.

9. The apparatus of claim 7, wherein the first circuitry comprises at least the decision circuitry, wherein the second circuitry comprises at least adder circuitry, and wherein the adder circuitry comprises a logical NAND gate.

10. The apparatus of claim 7, wherein second circuitry coupled to the first circuitry, wherein the second circuitry is configured to refrain from performing the subsequent operation in order to reduce an amount of power consumed in operation of a computing system that comprises the first circuitry, the second circuitry, the first array of memory cells, and the second array of memory cells.

11. The apparatus of claim 7, wherein:

the first circuitry is configured to determine the quantity of errors contained within each of the syndromes as part of performance of an operation to decode data associated with each of the syndromes, and the second circuitry is configured to determine that the quantity of errors for the at least one of the syndromes not fully decoded has reached the threshold quantity of errors as part of performance of the operation to decode data associated with each of the syndromes.

12. The apparatus of claim 7, wherein the second circuitry is configured to determine that the quantity of errors for at least the one of the syndromes not fully decoded has reached the threshold quantity of errors when each bit among the quantity of bits for at least the one of the syndromes not fully decoded has a logical value of zero.

13. The apparatus of claim 7, wherein the second circuitry is configured to determine that the quantity of errors for at least the one of the syndromes not fully decoded has reached the threshold quantity of errors when a determination is made that at least the one of the syndromes not fully decoded cannot be decoded successfully.

14. A system, comprising:

a first array of memory cells configured to store a plurality of syndromes that each comprise a plurality of bits of data;

shift circuitry configured to, for each of the plurality of syndromes, transfer the plurality of bits of data for each of the syndromes to decision circuitry coupled to the shift circuitry, wherein the decision circuitry is configured to determine a quantity of errors contained within each of the syndromes based on a quantity of bits having a logical value of one within each of the syndromes;

adder circuitry coupled to the decision circuitry, wherein the adder circuitry is configured to:

sum the quantity of bits having the logical value of one within each of the syndromes to generate a decoding completion indication for each of the syndromes; and determine, based on the decoding completion indication, that the quantity of errors for the syndromes has reached a threshold quantity of errors, and wherein the decision circuitry is configured to refrain from performing a subsequent operation to determine the quantity of errors contained within the at least one of the syndromes in response to the determination that the quantity of errors contained within the syndromes has reached the threshold quantity of errors, the decision circuitry to refrain from performing the subsequent operation by:

removing power supplied to a portion of the first memory array that stored the at least one of the syndromes.

15. The system of claim 14, wherein the adder circuitry comprises a logical NAND gate.

16. The system of claim 14, wherein:

the shift circuitry comprises a plurality of shift circuitries, the decision circuitry comprises a plurality of decision circuitries, and the shift circuitry and the decision circuitry are configured to process the plurality of syndromes concurrently.

17. The system of claim 14, further comprising decode completion circuitry coupled to a second array of memory cells configured to store the decoding completion indication for each of the syndromes, wherein the decode completion circuitry is configured to determine that a decoding operation involving the at least one of the syndromes is complete in response to the determination that the quantity of errors contained within the at least one of the syndromes has reached the threshold quantity of errors.

18. The system of claim 14, further comprising decode completion circuitry coupled to a second array of memory cells configured to store the decoding completion indication for each of the syndromes, wherein the decode completion circuitry is configured to determine that a decoding operation involving the at least one of the syndromes has failed in response to the determination that the quantity of errors contained within the at least one of the syndromes has reached the threshold quantity of errors.

19. The system of claim 14, wherein the decision circuitry is further configured to:

refrain from performing the subsequent operation to determine the quantity of errors contained within the at least one of the syndromes by removing power supplied to a portion of the shift circuitry associated with the at least one of the syndromes.

20. The system of claim 14, wherein the decision circuitry is configured to refrain from performing the subsequent operation in order to reduce an amount of power consumed in operation of a computing system that includes the first array of memory cells, a second array of memory cells, the decision circuitry, or the adder circuitry, or any combination thereof, wherein the second array of memory cells is configured to store the decoding completion indication for each of the syndromes.

* * * * *